(12) United States Patent
Zhang et al.

(10) Patent No.: US 11,028,971 B2
(45) Date of Patent: Jun. 8, 2021

(54) LED FILAMENT AND LAMP, AND MANUFACTURING PROCESS OF LED FILAMENT

(71) Applicant: HANGZHOU BINARY OPTOELECTRONICS & TECH. CO., LTD., Hangzhou (CN)

(72) Inventors: Gaole Zhang, Hangzhou (CN); Kang Zhou, Hangzhou (CN)

(73) Assignee: HANGZHOU BINARY OPTOELECTRONICS & TECH CO., LTD., Hangzhou (CN)

(*) Notice: Subject to any disclaimer, the term of this patent is extended or adjusted under 35 U.S.C. 154(b) by 0 days.

(21) Appl. No.: 16/474,780

(22) PCT Filed: Apr. 28, 2019

(86) PCT No.: PCT/CN2019/084724
§ 371 (c)(1),
(2) Date: Jun. 10, 2020

(87) PCT Pub. No.: WO2020/093664
PCT Pub. Date: May 14, 2020

(65) Prior Publication Data
US 2020/0326039 A1  Oct. 15, 2020

(30) Foreign Application Priority Data
Nov. 6, 2018 (CN) .......................... 201811311853.1

(51) Int. Cl.
*F21K 9/235* (2016.01)
*F21K 9/232* (2016.01)
(Continued)

(52) U.S. Cl.
CPC .............. *F21K 9/235* (2016.08); *F21K 9/232* (2016.08); *F21K 9/90* (2013.01); *F21V 9/30* (2018.02);
(Continued)

(58) Field of Classification Search
CPC ............................... F21K 9/235; F21V 19/005
See application file for complete search history.

(56) References Cited

U.S. PATENT DOCUMENTS 10,283,683 B1 * 5/2019 Chang .................. H01L 33/644
2015/0085489 A1 * 3/2015 Anderson ............... F21K 9/232
362/249.06
(Continued)

*Primary Examiner* — Evan P Dzierzynski
(74) *Attorney, Agent, or Firm* — Dorsey & Whitney LLP

(57) ABSTRACT

An LED filament and lamp, and a manufacturing process of an LED filament, the LED filament includes a PCB substrate and multiple LED chips, connecting circuits are provided on the PCB substrate, a positive pin and a negative pin are provided at two ends of the connecting circuit, respectively, and each LED chip is electrically connected to the connecting circuit; and a fluorescent glue layer is provided outside the PCB substrate and the LED chips, and the positive pin and the negative pin are exposed from the fluorescent glue layer. The LED lamp includes the LED filament. The manufacturing process of an LED filament enables manufacturing an LED filament. For the LED filament and lamp, and the manufacturing process of an LED filament, a PCB substrate is used as a base material, connecting circuits are fabricated on the PCB substrate, the connecting circuits are directly used for connecting LED chips.

19 Claims, 9 Drawing Sheets

(51) Int. Cl.
*F21V 9/30* (2018.01)
*F21K 9/90* (2016.01)
*F21V 19/00* (2006.01)
*H05K 1/03* (2006.01)
*H05K 1/11* (2006.01)
*H05K 1/14* (2006.01)
*H05K 1/18* (2006.01)
*F21Y 115/10* (2016.01)
*F21Y 107/50* (2016.01)

(52) U.S. Cl.
CPC ......... *F21V 19/005* (2013.01); *H05K 1/0366* (2013.01); *H05K 1/117* (2013.01); *H05K 1/14* (2013.01); *H05K 1/181* (2013.01); *F21Y 2107/50* (2016.08); *F21Y 2115/10* (2016.08); *H05K 2201/0108* (2013.01); *H05K 2201/09027* (2013.01); *H05K 2201/09163* (2013.01); *H05K 2201/10106* (2013.01); *H05K 2201/10318* (2013.01)

(56) References Cited

U.S. PATENT DOCUMENTS

| | | | |
|---|---|---|---|
| 2016/0363267 A1* | 12/2016 | Jiang | F21V 29/70 |
| 2017/0084809 A1* | 3/2017 | Jiang | H01L 33/56 |
| 2017/0196064 A1* | 7/2017 | Xiong | F21V 3/061 |
| 2017/0321849 A1* | 11/2017 | Xiong | H05B 45/10 |
| 2018/0252371 A1* | 9/2018 | Chelf | F21K 9/64 |
| 2018/0315899 A1* | 11/2018 | Li | F21K 9/232 |
| 2019/0115324 A1* | 4/2019 | Lee | H01L 33/50 |
| 2019/0154206 A1* | 5/2019 | Jiang | F21K 9/232 |

* cited by examiner

LED FILAMENT AND LAMP, AND MANUFACTURING PROCESS OF LED FILAMENT

CROSS-REFERENCE TO RELATED APPLICATIONS

The present disclosure is a national stage application under 35 U.S.C. § 371 of International Application No. PCT/CN2019/084724, filed Apr. 28, 2019, entitled "LED Filament and Lamp, and Manufacturing Process of LED Filament," which claims the priority of the Chinese Application No. 2018113118531, filed with the Chinese Patent Office on Nov. 6, 2018 and entitled "LED Filament and Lamp, and Manufacturing Process of LED Filament", both of which are incorporated herein by reference in their entirety.

TECHNICAL FIELD

The present disclosure relates to the field of LED illumination, and particularly to an LED filament and lamp, and a manufacturing process of an LED filament.

BACKGROUND ART

For most of the existing conventional LED filaments, ceramic, glass and sapphire are used as a substrate, on which an LED chip is mounted, and then the LED chip is powered on by using a noble metal wire.

The existing LED filaments have the following defects:

1. Defects will easily occur during the manufacturing and multiple welding processes of the LED filaments.

2. Welding metal wires increases the material cost, leads to more manufacturing procedures and low manufacturing efficiency, and also results in unstable electrical connection and poor electrical conductivity.

3. The substrates such as ceramic, glass and sapphire are brittle, are easy to break, and have high transportation and storage costs, but low service life.

SUMMARY

In view of the deficiencies in the prior art, the present disclosure provides an LED filament and lamp, and a manufacturing process of an LED filament, so as to solve the problem in the prior art that the LED filaments have high defect rate in manufacturing, high cost and low manufacturing efficiency, and are easy to break.

In order to solve at least one of the problems in the prior art, the present disclosure provides the followings:

An LED filament, comprising a PCB substrate and a plurality of LED chips, wherein a connecting circuit is provided on the PCB substrate, a positive pin and a negative pin are provided at the two ends of the connecting circuit, respectively, and each of the LED chips is electrically connected to the connecting circuit; and a fluorescent glue layer is provided outside the PCB substrate and the LED chips, and the positive pin and the negative pin are exposed from the fluorescent glue layer.

As an alternative solution of the above-described LED filament, the PCB substrate has any two-dimensional shape.

As an alternative solution of the above-described LED filament, the PCB substrate is in strip-shape.

As an alternative solution of the above-described LED filament, the positive pin and the negative pin can be provided at any position of the PCB substrate.

As an alternative solution of the above-described LED filament, the positive pin and the negative pin are provided at the same end of the PCB substrate.

As an alternative solution of the above-described LED filament, the PCB substrate comprises electrode arms and a connecting arm, one ends of the two electrode arms are connected by the connecting arm, and the other ends of the two electrode arms are provided with the positive pin and the negative pin, respectively.

As an alternative solution of the above-described LED filament, the PCB substrate is formed by cutting, with the PCB substrate formed in one piece, or the PCB substrate is formed by splicing the electrode arms and the connecting arm.

As an alternative solution of the above-described LED filament, the connecting arm is provided with a socket, and the socket is exposed from the fluorescent glue layer, and a plurality of the LED filaments are plugged into the socket and fixed to form a three-dimensional LED filament.

As an alternative solution of the above-described LED filament, the three-dimensional LED filament can be in any size and any shape in the three-dimensional space.

As an alternative solution of the above-described LED filament, the PCB substrate is thermally conductive.

As an alternative solution of the above-described LED filament, the PCB substrate is optically conductive so that light on one side of the PCB substrate can be transmitted to the other side.

As an alternative solution of the above-described LED filament, the LED chips are connected to at least one side of the PCB substrate, and at least one side of the PCB substrate is provided with a fluorescent glue layer, in which the content of fluorescent agent is adjusted so that the two sides of the LED filament have uniform light emission, preferably, the two sides of the LED filament have uniform light emission in color.

As an alternative solution of the above-described LED filament, the LED chips are connected to one side of the PCB substrate, both sides of the PCB substrate are provided with a fluorescent glue layer, and the fluorescent glue layers of the two sides have different contents of fluorescent agent, so that the two sides of the LED filament have uniform light emission, preferably, the two sides of the LED filament have uniform light emission in color.

As an alternative solution of the above-described LED filament, the connecting circuit is made by etching.

As an alternative solution of the above-described LED filament, the PCB substrate has both sides respectively provided with a connecting circuit and provided with the LED chips.

As an alternative solution of the above-described LED filament, the positive pin and the negative pin are pins that are welded on the PCB substrate and extend out from an end portion of the PCB substrate.

As an alternative solution of the above-described LED filament, the positive pin and the negative pin are formed by plating electrodes.

As an alternative solution of the above-described LED filament, the LED chips are connected to the PCB substrate by means of flip-chip, and the chips connected by the flip-chip have no power connection pins.

As an alternative solution of the above-described LED filament, a protection circuit or a control circuit is further integrated on the PCB substrate.

As an alternative solution of the above-described LED filament, the PCB substrate is a glass fiber PCB substrate, which is made by using epoxy resin as an adhesive and glass fiber cloth as a reinforcing material.

The present disclosure further provides:

An LED lamp, comprising a lamp holder and the above-described LED filament, wherein the lamp holder is provided with a socket, and the LED filament is plugged into the socket to form a detachable electrical connection with the lamp holder.

The LED lamp provided in the present disclosure which comprises the above-described LED filament includes, but is not limited to, the following lamp forms: bulb lamps, ceiling lamps, ceiling mount lamps, down lamps, flat lamps, kitchen and bathroom lamps, spot lamps, etc. The mounting manner that can be adopted for the LED lamp includes, but is not limited to, the following manners: wire suspension type, catenary suspension type, conduit suspension type, wall mounted type, flush type, ceiling mounted type, direct-attached type, etc. The mounting environment of the LED lamp includes, but is not limited to, the followings: mounting in ceiling, mounting in wall, mounting on counter, mounting on column, etc.

The present disclosure further provides:

A manufacturing process of an LED filament, comprising the steps of:

fabricating a connecting circuit on a PCB substrate, and connecting a positive pin and a negative pin to the two ends of the connecting circuit, respectively;

electrically connecting the LED chips to the connecting circuits and fixing the LED chips on a surface of the PCB substrate; and coating both sides of the PCB substrate with fluorescent glue to wrap the PCB substrate and the LED chips and expose the positive pin and the negative pin.

As an alternative solution of the above-described manufacturing process of an LED filament, the LED chips are connected to a single side of the PCB substrate, and the content of fluorescent agent in the fluorescent glue is adjusted so that the two sides of the PCB substrate have uniform light emission, preferably, the two sides of the LED filament have uniform light emission in color.

As an alternative solution of the above-described manufacturing process of an LED filament, a plurality of connecting circuits are fabricated on a substrate having an area larger than the PCB substrate of an LED filament and the LED chips are connected to the connecting circuits, both sides of the substrate are coated with fluorescent glue, and after the fluorescent glue is shaped, the substrate is cut to obtain an LED filament.

The present disclosure has at least the following advantages:

For the present LED filament, the LED chips are connected on a PCB substrate as a lampwick, and different from the conventional brittle lampwick substrate such as ceramic and glass, the PCB substrate has relatively good toughness and has no stress concentration, and the lampwick of the LED filament cannot be easily destroyed under the action of vibration and external forces. While electrical connection is formed between the LED chips and the connecting circuit, heat conduction is also formed between the LED chips and the PCB substrate. Thus, the LED filament has superior heat dissipation effect. The PCB substrate is suitable for various circuit arrangements, and different connecting circuits can be drawn according to requirements. The LED chips, the LED chips and the positive pins, and the LED chips and the negative pins do not need to be powered on by wires, which omits the use of metal wires, and leads to a simpler connecting process of the LED chips, and lower manufacturing cost. Moreover, the connecting circuit etched on the PCB substrate has good mechanical strength and relatively good stability, thereby making the quality of the LED filament more stable and reducing the defects in the LED filament.

The lamp comprises the LED filament, which has better durability, and the assembly of the LED filament of the lamp can be simplified by reasonably arranging the power connection pins on the LED filament.

For the manufacturing process of an LED filament, a PCB substrate is used as a base material, a connecting circuit is fabricated on the PCB substrate, the connecting circuit is directly used for connecting an LED chip, and there is no necessity to perform welding by using wires, which reduces the manufacturing cost and improves the manufacturing efficiency and the manufacturing yield rate; and the LED filament manufactured by this method has a more stable electrical connection structure, and is suitable for mass production.

In order to make it more obvious and easier to understand the above objects, features and advantages of the present disclosure, detailed description is made below in connection with preferred embodiments with reference to the accompanying drawings.

BRIEF DESCRIPTION OF DRAWINGS

In order to more clearly illustrate the technical solutions of the embodiments of the present disclosure, brief description is made below on the drawings required to be used in the embodiments. It should be understood that the following drawings only illustrate some of the embodiments of the present disclosure and therefore, shall not be regarded as a limitation to the scope, and for a person of ordinary skills in the art, other related drawings may be obtained from these drawings without inventive effort.

Reference signs: 1—lamp; 10—LED filament; 11—PCB substrate; 110—connecting circuit; 111—electrode arm;

112—connecting arm; 1121—socket; 12—LED chip; 13—fluorescent glue layer; 14—positive pin; 15—negative pin; 20—lamp holder; and 201—insertion hole.

DETAILED DESCRIPTION OF EMBODIMENTS

In order to facilitate understanding the present disclosure, the LED filament and lamp, and the manufacturing process of an LED filament will be described more comprehensively below with reference to the related drawings. The drawings illustrate preferred embodiments of the LED filament and lamp, and the manufacturing process of an LED filament. However, the LED filament and lamp, and the manufacturing process of an LED filament may be implemented in many different forms, without being limited to the embodiments described herein. Rather, the purpose of providing these embodiments is to provide more thorough and comprehensive disclosure of the LED filament and lamp, and the manufacturing process of an LED filament.

It should be noted that when an element is referred to as being "fixed to" another element, it may be directly on another element or there may be an intermediate element. When an element is considered to be "connected to" another element, it may be directly connected to another element or there may be an intermediate element. In contrast, when an element is referred to as being "directly on" another element, there exists no intermediate element. The terms "vertical", "horizontal", "left" and "right" and similar expressions used herein are used for illustrative purposes only.

Unless otherwise defined, all of the technical and scientific terms used herein have the same meaning as that commonly construed by those skilled in the technical field of the present disclosure. The terminology used in the description of the LED filament and lamp, and the manufacturing process of an LED filament herein only serves the purpose of describing the specific embodiments, rather than intending to limit the present disclosure. The term "and/or" used herein includes any of and all the combinations of one or more associated listed items.

Figure 1:
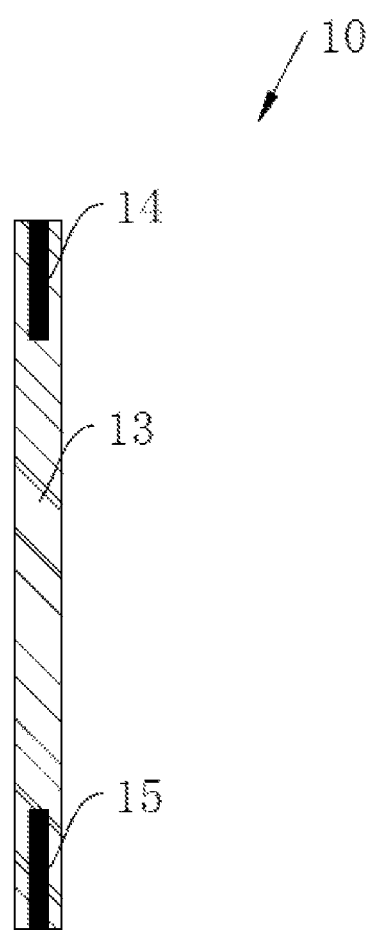
FIG. 1 is a front view of an LED filament provided in the present disclosure.
Figure 2:
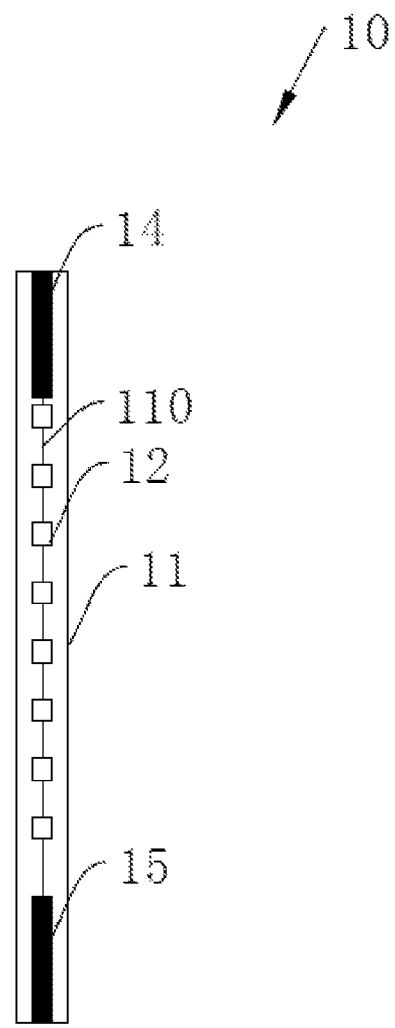
FIG. 2 is a schematic view of the internal structure of the LED filament of FIG. 1.

Referring to FIGS. 1 and 2 together, the present embodiment provides an LED filament 10, comprising a PCB substrate 11 and a plurality of LED chips 12. The PCB substrate 11 is provided with a positive pin 14 and a negative pin 15, and a connecting circuit 110 for electrically connecting the positive pin 14 and the negative pin 15, and each LED chip 12 is electrically connected to the connecting circuit 110. A fluorescent glue layer 13 is provided outside the PCB substrate 11 and the LED chips 12, and the positive pin 14 and the negative pin 15 are exposed from the fluorescent glue layer 13.

As described above, in the LED filament 10, the connecting circuit 110 is provided on the PCB substrate 11, the connecting circuit 110 may be formed by etching, and the LED chip 12 is electrically connected to the connecting circuit 110. By coating the PCB substrate 11 and the LED chips 12 with the fluorescent glue layer 13, the connecting circuit 110 and the LED chips 12 on the PCB substrate 11 are protected, and at the same time, the light emitted from the LED chips 12 is uniformly guided out. The positive pin 14 and the negative pin 15 are respectively exposed from the fluorescent glue layer 13 and used for the connection of a power supply, so that the LED chips 12 on the connecting circuit 110 emit light.

Unlike the conventional brittle lampwick substrates such as ceramic and glass, the PCB substrate 11 is a glass fiber PCB substrate, which may also be referred to as an epoxy plate, a glass fiber plate, FR4, a fiberboard, etc., with epoxy resin as an adhesive and glass fiber cloth as the reinforcing material. Such circuit board has a relatively high operating temperature, and can hardly be influenced by the environment. Moreover, the glass fiber plate enables the manufacturing of the two-sided PCB substrate 11, and allows etching of a circuit on both sides thereof, so that the LED filament 10 has more comprehensive light emitting angles. The glass fiber PCB substrate can be made to have light guiding property by, for example, being thinned to a certain thickness, so that light on one side of the PCB substrate can be transmitted to the other side.

In addition, the PCB substrate 11 may also contain a small amount of inorganic powder having high thermal conductivity, such as oxide powder (for example, aluminum oxide, silicon oxide, etc.) and nitride powder (aluminum nitride, silicon nitride, etc.), which enables the PCB substrate 11 to conduct heat, so that the LED filament 10 made by the PCB substrate 11 has relatively good heat dissipation effect. In one embodiment, the PCB substrate 11 is a glass fiber PCB substrate, with epoxy resin as an adhesive and glass fiber cloth as a reinforcing material, and a small amount of boron nitride and silicon nitride is added to the PCB substrate as an additive so that the PCB substrate 11 has thermal conductivity.

Moreover, the PCB substrate 11 has relatively good toughness and has no stress concentration, and the lampwick of the LED filament 10 cannot be easily destroyed under the action of vibration and external forces. While electrical connection is formed between the LED chip 12 and the connecting circuit 110, heat conduction is also formed between the LED chip 12 and the PCB substrate 11. Thus, the LED filament 10 has superior heat dissipation effect.

The PCB substrate 11 is suitable for various circuit arrangements, and different connecting circuits 110 can be drawn according to requirements. The LED chips 12, the LED chips 12 and the positive pins 14, and the LED chips 12 and the negative pins 15 do not need to be powered on by wires, which omits the use of metal bonding wires, and leads to a simpler connecting process of the LED chip 12, and lower manufacturing cost. Moreover, the connecting circuit 110 etched on the PCB substrate 11 has good mechanical strength and relatively good stability, thereby making the quality of the LED filament 10 more stable and reducing the defects in the LED filament 10.

In the present embodiment, the PCB substrate 11 is in strip-shape, and the PCB substrate 11 may also be in any two-dimensional shape such as a circular shape, an oval shape, a triangle shape and a polygon shape. The LED filament 10 matches with the PCB substrate 11 in shape, and therefore the LED filament 10 is in strip-shape or in column-shape after being coated with the fluorescent glue layer 13.

Figure 3:
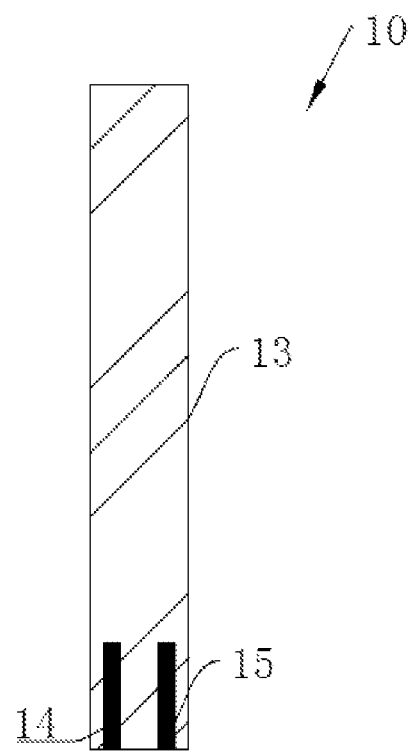
FIG. 3 is a front view of another LED filament provided in the present disclosure.

The positive pin 14 and the negative pin 15 can be provided at any position of the PCB substrate. In one embodiment, as shown in FIG. 3, the positive pin 14 and the negative pin 15 are provided at the same end of the PCB substrate 11 such that the power connection electrodes of the LED filament 10 are at the same end, and by providing insertion holes on the lamp holder that are matched with the LED filament 10, it is possible to realize the formation of plug-in electrical connection between the LED filament 10 and the lamp holder 20, which throws off welded connection, leads to simpler assembly and disassembly structures, reduces the assembly and maintenance costs, and improves the assembly efficiency.

Of course, in other embodiments, the positive pin 14 and the negative pin 15 may be provided at the two ends of the PCB substrate 11, i.e., the two ends of the LED filament 10, and are welded to a bracket and connected to the lamp holder 20 in the same manner as that used for a conventional filament.

It should be noted that the positive pin 14 and the negative pin 15 are powered on by the connecting circuit 110, and may be disposed at the two ends of the connecting circuit 110. The positive pin 14 and the negative pin 15 may be copper pins welded on the PCB substrate 11 and extending out from the end portion of the PCB substrate 11, or may be electrical connecting points plated on the surface of the PCB substrate 11.

The PCB substrate 11 can guide light. The PCB substrate 11 is a substrate that can guide light or has certain transmittance, so that light on one side of the PCB substrate can be transmitted to the other side. Therefore, no matter which side of the PCB substrate 11 the LED chip 12 is provided on, both sides of the LED filament 10 can emit light. In one embodiment, according to the requirements, the PCB substrate may be enabled to guide light, for example, by being thinned to a certain thickness. In another embodiment, a PCB substrate with a certain thickness is made directly so that the PCB substrate can guide light.

In the present embodiment, the LED chip 12 is connected to one side of the PCB substrate 11, the connecting circuit 110 is etched on a single side of the PCB substrate 11, and the fluorescent glue layer 13 is provided on both sides of the PCB substrate 11. Since the PCB substrate 11 has a thin plate shape, the above-mentioned side of the PCB substrate 11 is a plane of the PCB substrate 11 having the largest surface area, the remaining sides become the vertical surfaces of the PCB substrate 11, and the vertical surfaces of the PCB substrate 11 are not provided with fluorescent glue layer 13 and are exposed directly, so that direct exchange is enabled between the PCB substrate 11 and the outside environment, leading to better heat dissipation effect of the LED filament 10.

The fluorescent glue layers 13 of the two sides have different contents of fluorescent agent, so that the two sides of the LED filament 10 have uniform light emission, for example, the two sides of the LED filament 10 have uniform light emission in color. On one side of the LED filament 10, light is emitted directly from the LED chip 12, while on the other side thereof, light emitted by the LED chip 12 needs to be transmitted by the PCB substrate 11. Thus, the side on which light emitted by the LED chip 12 is transmitted by the PCB substrate 11 has lower brightness than the side on which light is emitted directly from the LED chip 12, which will result in nonuniform light emission brightness on the two sides of the LED filament 10, and by adjusting the content of fluorescent agent in the fluorescent glue layer 13, the light emission of the two sides of the LED filament 10 is made uniform or tends to be uniform.

The fluorescent glue layer 13 is made of the same material as the fluorescent glue layer 13 of the conventional LED filament 10, which is applied to the surface of the LED filament 10 to protect the inner lampwick, i.e., the PCB substrate 11 and the LED chip 12, and transmit the light emitted by the LED chip 12.

Understandably, the higher the content of fluorescent agent in the fluorescent glue layer 13 is, the higher the light emission brightness of the fluorescent glue layer 13 is, and the content of fluorescent agent in the fluorescent glue layer 13 on the side of the PCB substrate 11 provided with the LED chip 12 is lower than the content of fluorescent agent in the fluorescent glue layer 13 on the other side, so that the two sides of the LED filament 10 have uniform light emission, for example, the two sides of the LED filament 10 have uniform light emission in color. The content of fluorescent agent in the fluorescent glue layer 13 is related to the factors such as the requirement of the brightness of light emission and the power of light emission of the LED chip 12, and the difference in the content of fluorescent agent in the fluorescent glue layers 13 on the two sides is related with the light guiding property of the PCB substrate 11. In practical use, the content of fluorescent agent in the fluorescent glue layers 13 on the two sides of the LED filament 10 can be determined by means of experiments, so as to meet the requirement of uniformity of light emission and the requirement of brightness of light emission of the two sides of the LED filament 10.

Of course, in other embodiments, the connecting circuit 110 is etched on both sides of the PCB substrate 11, and the LED chips 12 are provided on both sides thereof.

As described above, the LED chips 12 may be the minimum light-emitting units in the LED illuminant, which are in a granular form and disposed along the connecting circuit 110. The LED chip 12 is a flip-chip, which is connected to the PCB substrate 11 by means of flip-chip, and the chips connected by the flip-chip have no power connection pins, which can reduce the space occupied by the power connection pins at the time of connecting the LED chip 12 and increase the permeability of light emission. The LED chips 12 can be closely distributed, which can meet the light emission requirements of the small-volume and high-brightness LED filament 10.

The PCB substrate 11 is a thin-plate type substrate that has relatively good toughness, relatively high strength and high temperature resistance and can guide light.

As described above, in addition to the connecting circuit 110 disposed on the PCB substrate 11, a protection circuit or a control circuit can also be integrated on the PCB substrate 11, thereby optimizing the process of assembly of the LED filament 10 on the lamp, so that the structure of the lamp is more concise, and the reliability of the LED filament 10 is increased.

Figure 4:
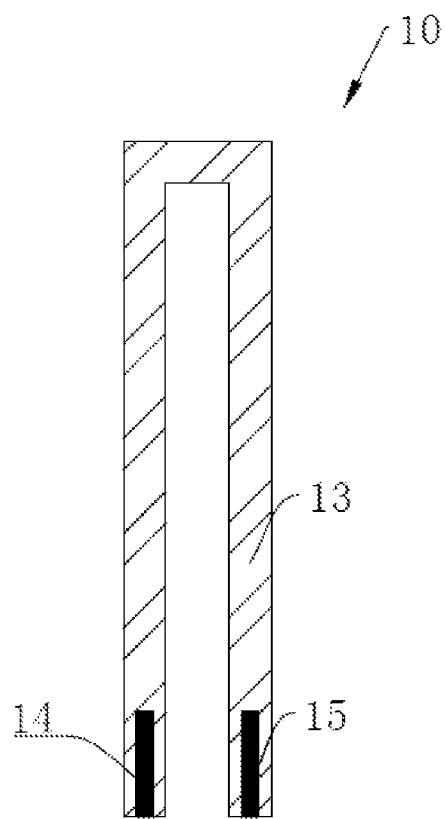
FIG. 4 is a front view of an LED filament provided in the present disclosure.
Figure 5:
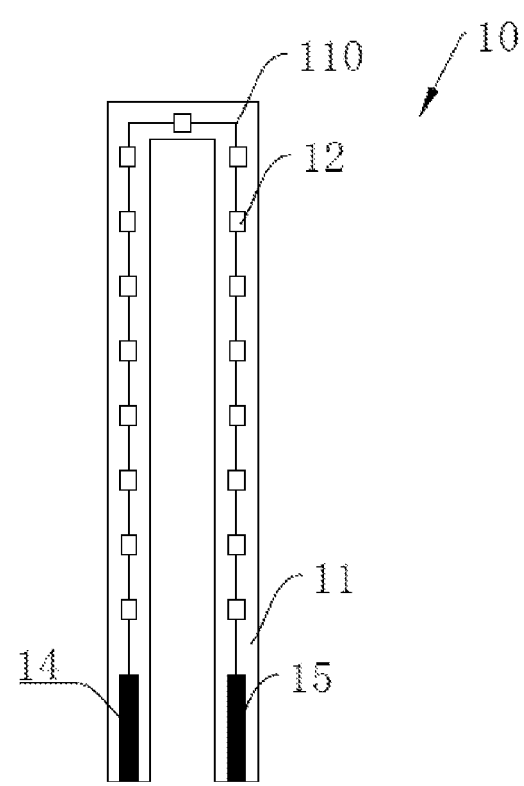
FIG. 5 is a schematic view of the internal structure of the LED filament of FIG. 4.

Optionally, referring to FIG. 4 and FIG. 5 together, this embodiment is distinguished from embodiment 1 in that the shape of the LED filament 10 is non-strip-shaped or non-column-shaped, that is, the PCB substrate 11 is not strip-shaped. The PCB substrate 11 comprises electrode arms 111 and a connecting arm 112, one ends of the two electrode arms 111 are connected by the connecting arm 112, and the other ends of the two electrode arms 111 are provided with a positive pin 14 and a negative pin 15, respectively. The PCB substrate 11 is a specially-shaped substrate, and the LED filament 10 is a specially-shaped filament.

Further, the PCB substrate 11 has a shape of "⊏", wherein the electrode arms 111 and the connecting arm 112 are in strip-shape, and the positive pin 14 and the negative pin 15 are provided on the two sides of the opening of the PCB substrate 11, that is, they are respectively provided at the hanging ends of the electrode arms 111. The connecting circuit 110 extends from the positive pin 14 to the negative pin 15, that is, the connecting circuit 110 is arranged along the PCB substrate 11, and the LED chips 12 are connected along the PCB substrate 11, so that the LED filament 10 is a filament emitting light in the shape of "⊏".

In other embodiments, the electrode arms 111 are in strip-shape and the connecting arm 112 is bent or angled, so that the PCB substrate 11 has a shape of "M"; or the connecting arm 112 is connected between the electrode arms 111 at their middles so that the PCB substrate 11 has a shape of "H"; or the connecting arm 112 is connected at opposite ends of the electrode arms 111 so that the PCB substrate 11 has a shape of "N", and in this case, the positive pin 14 and the negative pin 15 are provided at the hanging ends of the electrode arms 111, that is, the power connection pins are provided at the two ends of the PCB substrate 11.

The PCB substrate 11 may be formed by cutting, with the PCB substrate formed in one piece, the electrode arms 111 and the connecting arm 112 are formed in one piece by cutting, or may be formed by splicing strips, i.e., by splicing the strip-shaped electrode arms 111 and connecting arm 112, that is, by splicing unit plates.

In the present embodiment, the PCB substrate 11 is formed by cutting, with the PCB substrate formed in one piece, and the spacing between the two electrode arms 111 is half the width of the electrode arm 111, so that a "⊏"-shaped PCB substrate 11 is formed by cutting a large substrate by using n-u-crossed distribution, which minimizes the waste of material.

When the LED filament 10 of the present embodiment is connected to the lamp holder, the positive pin 14 and the negative pin 15 are also at the same end. Therefore, the present LED filament 10 can also be electrically connected to the lamp holder by plug-in connection with the lamp holder, and there is no necessity of welding.

Figure 6:
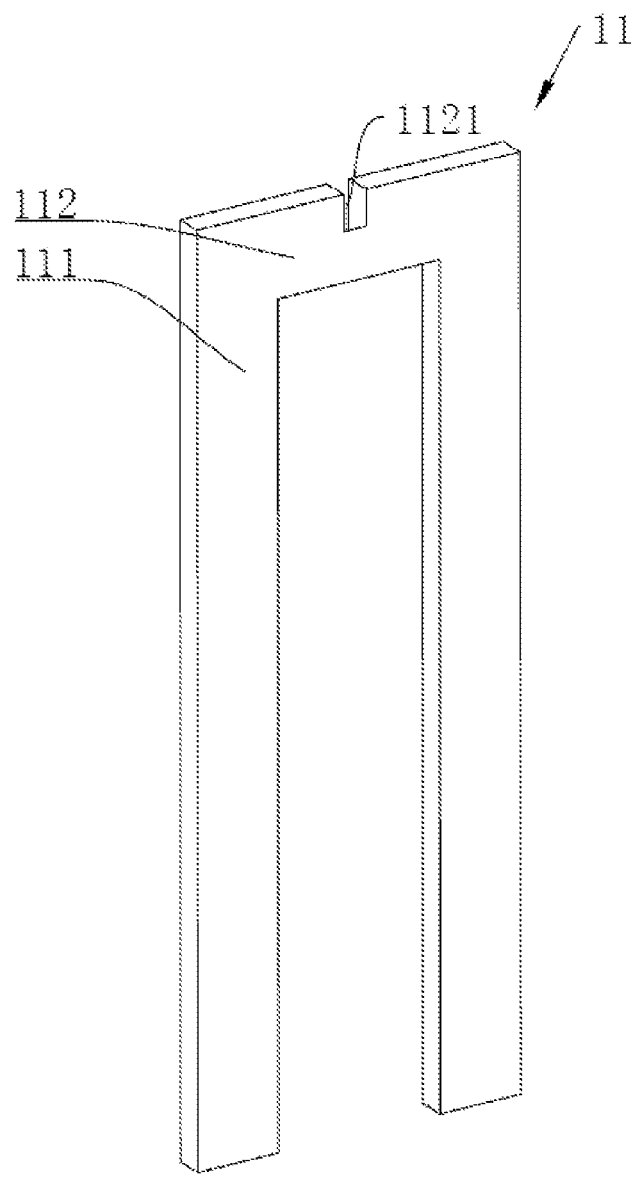
FIG. 6 is an axonometric structural schematic view of a PCB substrate of the LED filament provided in the present disclosure.
Figure 7:
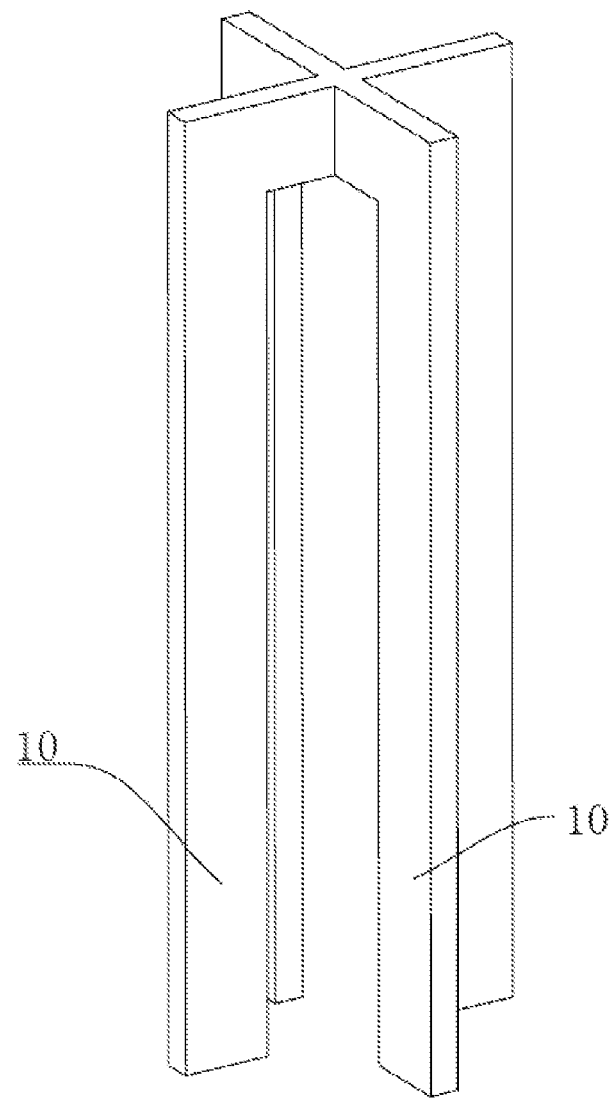
FIG. 7 is an axonometric structural schematic view of forming the LED filaments provided in the present disclosure into a three-dimensional filament by insertion.

Referring to FIG. 6 and FIG. 7 together, the connecting arm 112 is provided with a socket 1121, and the socket 1121 is exposed from the fluorescent glue layer 13, and a plurality of LED filaments 10 are plugged into the socket 1121 and fixed to form a three-dimensional LED filament 10, wherein the LED filament 10 can be in any size and any shape in the three-dimensional space so that the LED filament can emit light in any direction in the three-dimensional space. The "⊏"-shaped LED filament 10 can be regarded as a filament with planar light emission. By providing the socket 1121 on the connecting arm 112, the LED filament 10 can be plugged therein and fixed. Such plug-in connection is similar to jigsaw puzzles, which are children's educational toys. The sheet-shaped LED filaments 10 are staggered at a certain angle and then connected by plugging into each other, thereby forming a three-dimensional frame-shaped LED filament 10.

In this embodiment, two "⊏"-shaped LED filaments 10 form a cross-shaped plug-in connection, that is, the connecting arms 112 of the LED filaments 10 are distributed in a cross shape with one being perpendicular to the other, and are connected by the sockets 1121. The socket 1121 on one LED filament 10 faces upwards, the socket 1121 on the other LED filament 10 faces downwards, the four electrode arms 111 of the two LED filaments 10 are parallel, and the pins are provided at the same end of the three-dimensional LED filament 10. The three-dimensional LED filament 10 has four pins, and four insertion holes can be provided on the lamp holder, so that the three-dimensional LED filament 10 can be directly plugged into the lamp holder.

Figure 8:
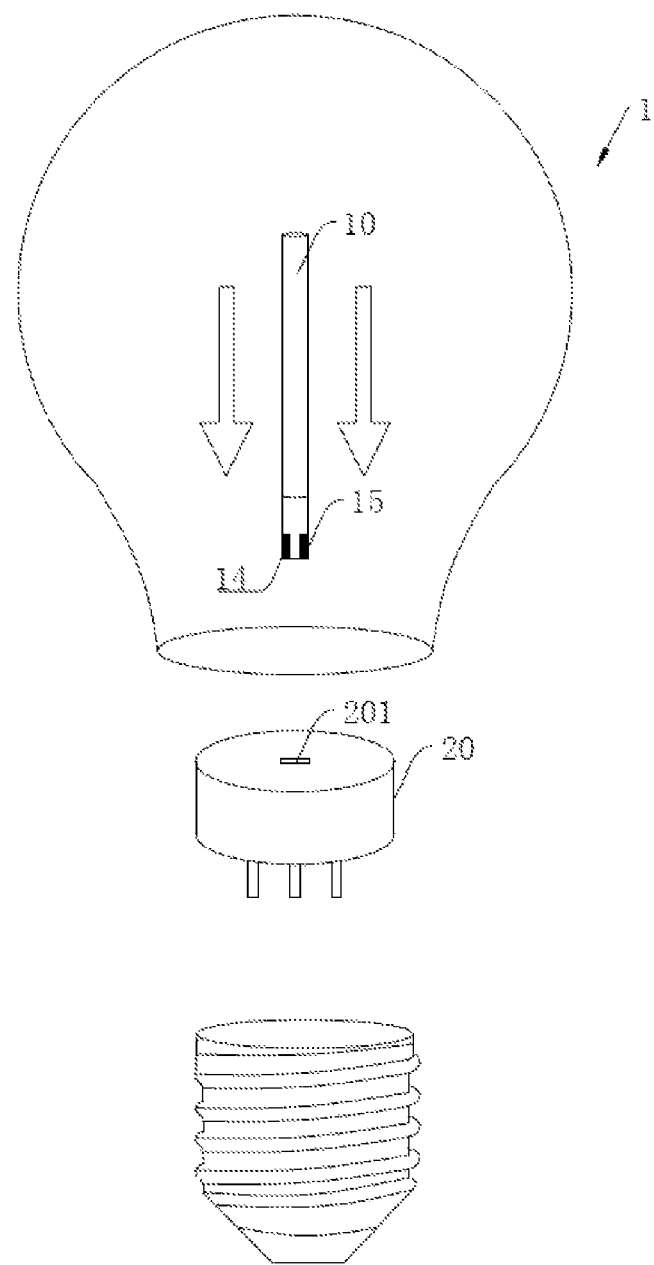
FIG. 8 is an exploded structural schematic view of an LED lamp provided in the present disclosure.

Optionally, as shown in FIG. 8, the present embodiment provides a lamp 1, comprising a lamp holder 20 and the LED filament 10 in embodiment 1, wherein the lamp holder 20 is provided with an insertion hole 201, and the LED filament 10 is plugged into the insertion hole 201 to form a detachable electrical connection with the lamp holder 20.

The positive pin 14 and the negative pin 15 on the LED filament 10 are end electrodes plated at the same end portion, and the lamp holder 20 is provided with an insertion hole 201 matched with the LED filament 10. The LED filament 10 is entirely inserted into the insertion hole 201, and in the insertion hole 201 are provided electrical connection contacts capable of making electrical contact with the positive pin 14 and the negative pin 15.

Figure 9:
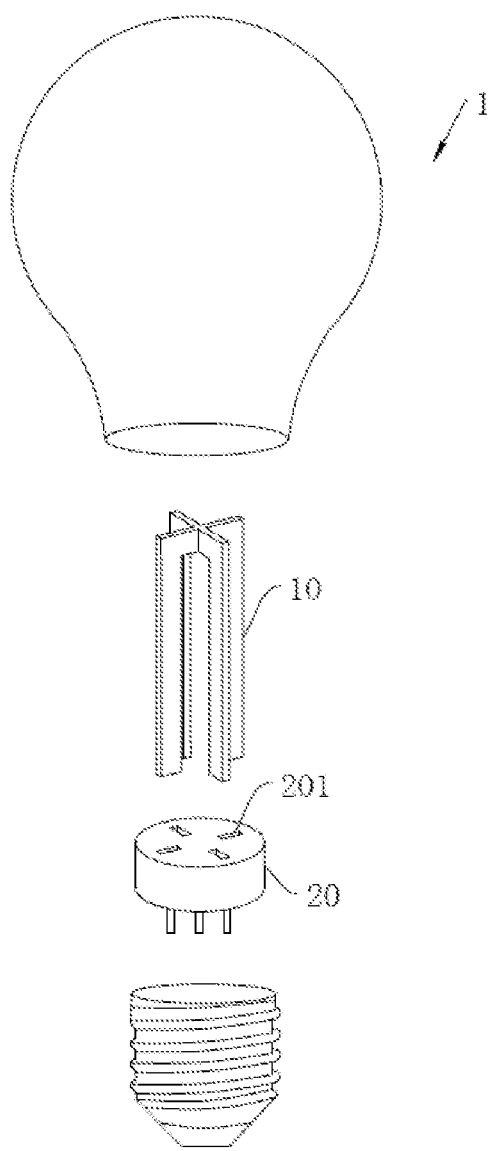
FIG. 9 is an exploded structural schematic view of another LED lamp provided in the present disclosure.

As shown in FIG. 9, in another embodiment, the lamp 1 comprises a lamp holder 20 and the LED filament 10 in embodiment 2. The lamp holder 20 is provided with four insertion holes 201 arranged in a cross shape, in other words, the connecting lines of each pair of opposite insertion holes 201 are arranged in a cross. In the insertion hole 201 are correspondingly provided positive and negative electrical contacts or positive and negative electrical elastic pieces. It is feasible to insert one "⊏"-shaped LED filament 10 into two opposite insertion holes 201, or insert two LED filaments 10 into four insertion holes 201 to form a three-dimensional filament.

Figure 11:
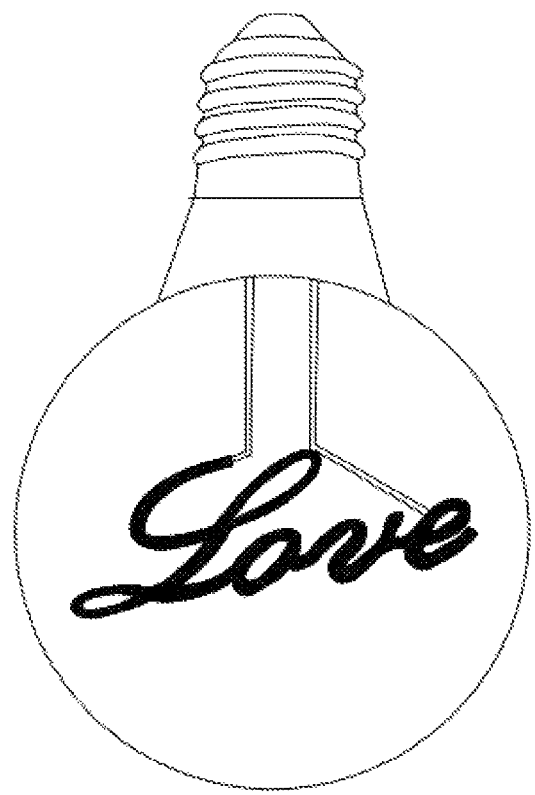
FIG. 11 is a structural schematic view of an LED lamp provided by the present disclosure that comprises the LED filament provided by the present disclosure.
Figure 12:
FIG. 12 is a structural schematic view of another LED lamp provided by the present disclosure that comprises the LED filament provided by the present disclosure.

Optionally, as shown in FIGS. 11 and 12, the present disclosure provides a structural schematic view of an LED lamp comprising the LED filament provided by the present disclosure. The LED lamp provided in the present disclosure includes, but is not limited to, the following lamp forms: bulb lamps, ceiling lamps, ceiling mount lamps, down lamps, flat lamps, kitchen and bathroom lamps, spot lamps, etc. The mounting manner that can be adopted for the LED lamp includes, but is not limited to, the following manners: wire suspension type, catenary suspension type, conduit suspension type, wall mounted type, flush type, ceiling mounted type, direct-attached type, etc. The mounting environment of the LED lamp includes, but is not limited to, the followings: mounting in ceiling, mounting in wall, mounting on counter, mounting on column, etc.

Optionally, the present embodiment provides a manufacturing process of the LED filament 10, comprising the following steps:

I. Fabricating a connecting circuit 110 on a PCB substrate 11, and connecting a positive pin 14 and a negative pin 15 to the two ends of the connecting circuit 110, respectively.

In the above, for the fabrication of the connecting circuit 110 on the PCB substrate 11, it is feasible to form the corresponding circuit by etching, and the LED chip 12 connected to the connecting circuit 110 may be electrically connected to the connecting circuit 110.

The two ends of the connecting circuit 110 are connected to the positive pin 14 and the negative pin 15, respectively, and the power connection end of the connecting circuit 110 can be led out by welding a conductor such as a copper wire on the PCB board.

In another embodiment, the positive pin 14 and the negative pin 15 at the two ends of the connecting circuit 110 are formed by plating electrodes, and the positive pin 14 and the negative pin 15 do not extend out from the PCB substrate 11, but form electrical contacts on the PCB substrate 11.

II. Connecting the LED chip 12 to an electrical connection port and fixing the LED chip 12 on a surface of the PCB substrate 11.

The LED chip 12 may be a flip-chip, which is connected to the PCB substrate 11 by means of flip chip. Specifically, tin alloy on the electrode contact surface plating of the LED chip 12 is welded to the connecting circuit 110 by the technology of eutectic/reflow welding so that the LED chip 12 is electrically connected to the connecting circuit 110.

III. Coating both sides of the PCB substrate 11 with fluorescent glue to wrap the PCB substrate 11 and the LED chip 12 and expose the positive pin 14 and the negative pin 15.

The PCB substrate 11 and the LED chip 12 are protected by coating fluorescent glue thereon, so as to protect the overall structural strength of the LED filament 10, so that the electrical structure of the LED filament 10 other than the positive pin 14 and the negative pin 15 is built in, and meanwhile, the light emitted from the LED chip 12 is guided out, to enhance and optimize the luminescence characteristic by fluorescence effect.

In this embodiment, the LED chip 12 is connected to a single side of the PCB substrate 11, and by adjusting the content of fluorescent agent in the fluorescent glue, the two sides of the PCB substrate 11 have uniform light emission, for example, the two sides of the LED filament have uniform light emission in color. The method has been described in embodiment 1, and will not be repeated here.

The LED filament 10 manufactured in this embodiment is a strip-shaped LED filament 10, which is fabricated on a block of large substrate, this block of substrate has a larger area than the PCB substrate 11, specifically, has a width that is the same as the length of the PCB substrate 11, and a length that is on the order of tens or hundreds times the width of the PCB substrate 11.

Figure 10:
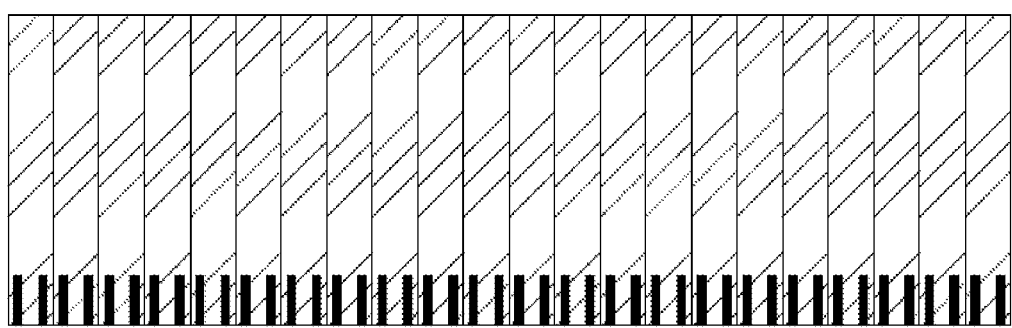
FIG. 10 is a structural schematic view showing the fabrication of a plurality of LED filaments on a large substrate in a manufacturing process of an LED filament provided in the present disclosure.

As shown in FIG. 10, steps I-III are performed on the large substrate, i.e., etching a plurality of connecting circuits 110 on the large substrate, connecting a positive pin 14 and a negative pin 15 to the two ends of each connecting circuit 110, mounting, by flip chip, an LED chip 12 on each connecting circuit 110, and then coating both sides of the large substrate with fluorescent glue, with the content of fluorescent agent in the fluorescent glue coated on the side provided with the LED chip 12 being lower than the content of fluorescent agent in the fluorescent glue coated on the other side.

The method further comprises the following step:

IV. Cutting the large substrate to obtain the LED filament 10.

Specifically, cutting is performed after the fluorescent glue is shaped, cutting may be performed by laser cutting, e.g., ultraviolet laser, and shaping of the fluorescent glue may be accelerated by the method of stoving.

The spacing between adjacent connecting circuits 110, or the spacing between the LED chips 12 on adjacent connecting circuits 110, should be slightly larger for cutting consumption so as to meet the requirement of cutting, and prevent the LED chip 12 from being damaged at the time of obtaining the LED filament 10 by cutting.

The method of forming a connecting circuit 110 on a large substrate, connecting a positive pin 14, a negative pin 15 and an LED chip 12 thereto, coating them with fluorescent glue and then cutting the same to obtain strip-shaped LED filaments 10 enables easier clamping and fixing of the substrate on the one hand (as a large size enables easier clamping and positioning), and enhances the efficiency of coating the fluorescent glue on the other hand.

In all of the examples illustrated and described herein, any specific value should be construed as being exemplary only, rather than serving the purpose of limiting, and therefore other examples of the exemplary embodiments may have a different value.

It should be noted that similar reference signs and letters denote similar items in the following drawings, and therefore, once a certain item is defined in one drawing, it does not need to be further defined or explained in the subsequent drawings.

The above-described embodiments represent only several implementation modes of the present disclosure, the description of which is relatively specific and detailed, but they should not be construed as limiting the scope of the present disclosure. It should be noted that, for those of ordinary skills in the art, some modifications and improvements may be made without departing from the concept of the present disclosure, and all the modifications and improvements fall within the scope of protection of the present disclosure.

INDUSTRIAL APPLICABILITY

For the LED filament provided in the present disclosure, an LED chip is connected on a PCB substrate as a lampwick, and different from the conventional brittle lampwick substrates, the PCB substrate has relatively good toughness and has no stress concentration, and the lampwick of the LED filament cannot be easily destroyed under the action of vibration and external forces. While electrical connection is formed between the LED chip and the connecting circuit, heat conduction is also formed between the LED chip and the PCB substrate. Thus, the LED filament has superior heat dissipation effect. The PCB substrate is suitable for various circuit arrangements, and different connecting circuits can be drawn according to requirements. Moreover, the connecting circuit etched on the PCB substrate has good mechanical strength and relatively good stability, thereby making the quality of the LED filament more stable and reducing the defects in the LED filament.

The lamp provided in the present disclosure comprises the LED filament, which has better durability, and the assembly of the LED filament of the lamp can be simplified by reasonably arranging the power connection pins on the LED filament.

The present disclosure provides a manufacturing process of an LED filament, wherein a PCB substrate is used as a base material, a connecting circuit is fabricated on the PCB substrate, the connecting circuit is directly used for connecting an LED chip, and there is no necessity to perform welding by using wires, which reduces the manufacturing cost and improves the manufacturing efficiency and the manufacturing yield rate; and the LED filament manufactured by this method has a more stable electrical connection structure, and is suitable for mass production.

The invention claimed is:

1. An LED filament comprising:
a PCB substrate and a plurality of LED chips, wherein the PCB substrate is a glass fiber substrate, a connecting circuit is provided on the PCB substrate, a positive pin and a negative pin are provided at two ends of the connecting circuit, respectively, and each of the LED chips is electrically connected to the connecting circuit;
a fluorescent glue layer is provided outside the PCB substrate and the LED chips, and the positive pin and the negative pin are exposed from the fluorescent glue layer; and
the PCB substrate further comprises electrode arms and a connecting arm, first ends of two electrode arms are connected by the connecting arm, and the other ends of the two electrode arms are provided with the positive pin and the negative pin, respectively.

2. The LED filament according to claim 1, wherein the PCB substrate can be in any two-dimensional shape.

3. The LED filament according to claim 1, wherein the positive pin and the negative pin can be provided at any positions of the PCB substrate.

4. The LED filament according to claim 1, wherein the PCB substrate is formed by cutting, with the PCB substrate formed in one piece, or the PCB substrate is formed by splicing the electrode arms and the connecting arm.

5. The LED filament according to claim 1, wherein the connecting arm is provided with a socket, and the socket is exposed from the fluorescent glue layer, and a plurality of the LED filaments are plugged into the socket and fixed to form a three-dimensional LED filament.

6. The LED filament according to claim 1, wherein the connecting circuit is made by etching.

7. The LED filament according to claim 1, wherein the PCB substrate is optically conductive and/or thermally conductive.

8. The LED filament according to claim 1, wherein the LED chips are connected to at least one side of the PCB substrate, and at least one side of the PCB substrate is provided with the fluorescent glue layer, and a content of fluorescent agent in the fluorescent glue layer is adjusted so that two sides of the LED filament have uniform light emission.

9. The LED filament according to claim 8, wherein the LED chips are connected to one side of the PCB substrate, both sides of the PCB substrate are provided with the fluorescent glue layer, and the fluorescent glue layers of two sides have different contents of fluorescent agent, so that the two sides of the LED filament have uniform light emission.

10. The LED filament according to claim 1, wherein the PCB substrate has both sides respectively provided with the connecting circuits and provided with the LED chips.

11. The LED filament according to claim 1, wherein the positive pin and the negative pin are pins that are welded on the PCB substrate and extend out from an end portion of the PCB substrate.

12. The LED filament according to claim 1, wherein the positive pin and the negative pin are formed by plating electrodes.

13. The LED filament according to claim 1, wherein the LED chips are connected to the PCB substrate by means of flip-chip, and chips connected by the flip-chip have no power connection pins.

14. The LED filament according to claim 1, wherein a protection circuit or a control circuit is further integrated on the PCB substrate.

15. The LED filament according to claim 1, wherein the PCB substrate is a glass fiber PCB substrate, which is made by using epoxy resin as an adhesive and glass fiber cloth as a reinforcing material.

16. An LED lamp, comprising a lamp holder and the LED filament according to claim 1, wherein the lamp holder is provided with a socket, and the LED filament is plugged into the socket to form a detachable electrical connection with the lamp holder.

17. A manufacturing process of an LED filament according to claim 1, comprising steps of:
    fabricating connecting circuits on a PCB substrate, and connecting a positive pin and a negative pin to two ends of the connecting circuit, respectively;
    electrically connecting LED chips to the connecting circuits and fixing the LED chips on a surface of the PCB substrate; and
    coating both sides of the PCB substrate with fluorescent glue to wrap the PCB substrate and the LED chips and expose the positive pin and the negative pin.

18. The manufacturing process of an LED filament according to claim 17, wherein the LED chips are connected to a single side of the PCB substrate, and a content of fluorescent agent in the fluorescent glue is adjusted so that two sides of the PCB substrate have uniform light emission.

19. The manufacturing process of an LED filament according to claim 17, wherein a plurality of the connecting circuits are fabricated on a substrate having an area larger than the LED filament, the LED chips are connected to the connecting circuits, both sides of the substrate are coated with the fluorescent glue, and after the fluorescent glue is shaped, the substrate is cut to obtain the LED filament.

* * * * *